US008476592B2

(12) United States Patent
Jeon et al.

(10) Patent No.: US 8,476,592 B2
(45) Date of Patent: Jul. 2, 2013

(54) TERAHERTZ WAVE APPARATUS

(75) Inventors: Min Yong Jeon, Daejeon (KR); Kyung Hyun Park, Daejeon (KR); Dae-Su Yee, Daejeon (KR)

(73) Assignees: Electronics and Telecommunications Research Institute, Daejeon (KR); Korea Research Institute of Standards and Science, Daejeon (KR)

( * ) Notice: Subject to any disclaimer, the term of this patent is extended or adjusted under 35 U.S.C. 154(b) by 168 days.

(21) Appl. No.: 12/908,628

(22) Filed: Oct. 20, 2010

(65) Prior Publication Data

US 2011/0192978 A1 Aug. 11, 2011

(30) Foreign Application Priority Data

Feb. 11, 2010 (KR) .................. 10-2010-0012893
Jun. 11, 2010 (KR) .................. 10-2010-0055614

(51) Int. Cl.
*G01J 5/02* (2006.01)
(52) U.S. Cl.
USPC ................... 250/339.06; 250/340
(58) Field of Classification Search
USPC .................... 250/339.06, 340
See application file for complete search history.

(56) References Cited

U.S. PATENT DOCUMENTS

| 5,352,885 | A | 10/1994 | Niki | |
|---|---|---|---|---|
| 5,991,316 | A * | 11/1999 | Kikuchi | 372/21 |
| 6,144,679 | A * | 11/2000 | Herman et al. | 372/21 |
| 7,054,339 | B1 | 5/2006 | Hu et al. | |
| 7,539,221 | B1 * | 5/2009 | Jiang et al. | 372/12 |
| 2007/0160093 | A1 * | 7/2007 | Nishizawa et al. | 372/21 |
| 2009/0174931 | A1 * | 7/2009 | Huber et al. | 359/340 |
| 2011/0051148 | A1 * | 3/2011 | Flanders et al. | 356/519 |
| 2011/0149368 | A1 * | 6/2011 | Kim et al. | 359/276 |
| 2012/0153148 | A1 * | 6/2012 | Federici et al. | 250/332 |

FOREIGN PATENT DOCUMENTS

| DE | 692 12 927 T2 | 2/1997 |
|---|---|---|
| DE | 693 10 576 T2 | 10/1997 |
| EP | 524 382 A2 | 1/1993 |
| JP | 2006-091802 A | 4/2006 |
| JP | 2006-215222 A | 8/2006 |
| JP | 2009-033078 A | 2/2009 |
| JP | 2010-010172 A | 1/2010 |
| KR | 10-0926039 A | 11/2009 |

OTHER PUBLICATIONS

Jeon et al., Characterization of Fourier domain modelocked wavelength swept laser for optical coherence tomography imaging, 2008, Optics Express, vol. 16, pp. 3727-3737.*
Matsuura et al., A Tunable Cavity-Locked Diode Laser Source for Terahertz Photomixing, 2000, IEEE Transactions on Microwave Theory and Techniques, vol. 48, pp. 380-387.*

(Continued)

*Primary Examiner* — Christine Sung
(74) *Attorney, Agent, or Firm* — Rabin & Berdo, P.C.

(57) ABSTRACT

Provided is a terahertz wave apparatus. The terahertz wave apparatus includes: a wavelength-fixed laser emitting a first laser light having a fixed first wavelength; a wavelength-swept laser emitting a second laser light having a tunable second wavelength; a coupler coupling the first laser light with the second laser light; and a generator converting a mixed light emitted from the coupler into a terahertz wave, wherein a frequency of the terahertz wave is continuously tunable.

14 Claims, 5 Drawing Sheets

OTHER PUBLICATIONS

Yun et al., Wavelength-Swept Fiber Laser with Frequency Shifted Feedback and Resonantly Swept Intra-Cavity Acoustooptic Tunable Filter, 1997, IEEE Journal of Selected Topics in Quantum Electronics, vol. 3, p. 1087-1096.*

Creeden, Daniel, et al., "Compact, high . . .", Optics Express; vol. 15; 2007; 547-6483.

Kim, Namje, et al., "Monolithic dual-mode . . .", Optics Express; vol. 17; 2009; 13851-13859.

Yun, S. H., et al., "Wavelength-Swept Fiber Laser . . .", IEEE Journal of Selected Topics in Quantum Electronics; vol. 3; 1997; NR 4; S1087 1096.

Jeom, Min Yong, et al., "Characterization of Fourier domail . . .", Optics Express; vol. 16; 2008; Nr 6; S 3727 3737.

Matsuura, Shuji., "A Tunable Cavity-Locked Diode Laser . . .", IEEE Transactions on Microwave Theory and Techniques; vol. 48; 2000; No. 3; S 380-387.

* cited by examiner

TERAHERTZ WAVE APPARATUS

CROSS-REFERENCE TO RELATED APPLICATIONS

This U.S. non-provisional patent application claims priority under 35 U.S.C. §119 of Korean Patent Application Nos. 10-2010-0012893, filed on Feb. 11, 2010, and 10-2010-0055614, filed on Jun. 11, 2010, the entire contents of which are hereby incorporated by reference.

BACKGROUND OF THE INVENTION

The present invention disclosed herein relates to a terahertz wave apparatus, and more particularly, to a wavelength tuning terahertz wave apparatus.

In relation to a terahertz wave band (e.g., a range of about 0.1 THz to about 3 THz), terahertz waves may penetrate nonmetal and nonpolar substances. In addition, resonant frequencies of various molecules are distributed in the terahertz wave band. Therefore, since those molecules are detected in real time through a non-destructive, non-opening, and non-contact method, they may be used as a new conceptual analysis technology in various fields such as medical service, medicine, agriculture, food, environmental measurement, bio, and advanced material evaluation. Accordingly, terahertz wave technologies rapidly expand into various kinds of applications. Since terahertz waves have almost no effect on human bodies due to a very low energy level of several meV, as essential core technology for realizing human-oriented ubiquitous society, demands on terahertz waves have been drastically increased. However, terahertz wave technologies for satisfying real-time, portable, and economical properties have not been developed yet.

Examples of currently-used terahertz continuous wave generating methods include a frequency multiplying method, a backward wave emitting method, a photo-mixing method, a $CO_2$ pumped gas laser method, a quantum cascade laser method, and a free electron laser method. Many studies are being conducted to develop a terahertz wave source operating in a frequency band of about 0.1 THz to about 10 THz, a so-called terahertz gap band. However, small-size, non-cooling, high-performance wave source technology necessary for commercialization has not been developed maturely. In addition, technology for tuning terahertz waves in a wide frequency band has not been developed also. If terahertz waves are tuning at fast speed in a wide frequency band, it is possible to monitor a variety of physical phenomena in real time within a terahertz wave band.

The most extensively used terahertz wave apparatus until recently is a time domain spectroscopy apparatus that generates and detects terahertz pulse waves by projecting a femto-second level ultra-short laser pulse on a photoconductive antenna based on a semiconductor with a high-speed response time. A terahertz wave apparatus including the femtosecond level ultra-short pulse laser and the photoconductive antenna has advantages such as a high signal-to-noise ratio (SNR) but also has limitations in developing it into a measuring instrument in aspects of price and size because it requires a femtosecond level pulse laser and a very precise optical system.

SUMMARY OF THE INVENTION

The present invention provides a terahertz wave apparatus generating and detecting continuously frequency-tunable terahertz waves.

Embodiments of the present invention provide terahertz wave apparatuses including: a wavelength-fixed laser emitting a first laser light having a fixed first wavelength; a wavelength-swept laser emitting a second laser light having a tunable second wavelength; a coupler coupling the first laser light with the second laser light; and a generator converting a mixed light emitted from the coupler into a terahertz wave, wherein a frequency of the terahertz wave is continuously tunable.

In some embodiments, the generator may generate a terahertz wave having a frequency that corresponds to a difference value between the first wavelength and the second wavelength.

In other embodiments, the wavelength-swept laser may include: a gain medium; and a wavelength tuning filter filtering light emitted from the gain medium into the second wavelength.

In still other embodiments, the gain medium and the wavelength tuning filter may be combined to an optical fiber.

In even other embodiments, the gain medium may include a semiconductor optical amplifier.

In yet other embodiments, the gain medium may include a rare-earth element-doped optical fiber.

In further embodiments, the rare-earth element may include at least one of Er or Yb.

In still further embodiments, the wavelength tuning filter may include
a fiber fabry-perot tunable filter (FFP-TF)

In even further embodiments, the wavelength-swept laser may further include a high frequency driver applying a voltage in a pulse form to the FFP-TF.

In yet further embodiments, the FFT-TF may filter the continuously tuned second wavelength according to the applied voltage.

In yet further embodiments, the wavelength-swept laser may further include an optical isolator that progresses the second laser light in one direction.

In yet further embodiments, the wavelength-swept laser may further include an output optical fiber coupler outputting a portion and feeding back another portion to the gain medium.

In yet further embodiments, the apparatuses may further include a detector detecting a terahertz wave that is emitted from the generator and transmitted through a sample.

In yet further embodiments, the apparatuses may further include a data acquisition device triggered using a synchronization signal provided from the high frequency driver and continuously acquiring a detection signal from the detector.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1A:
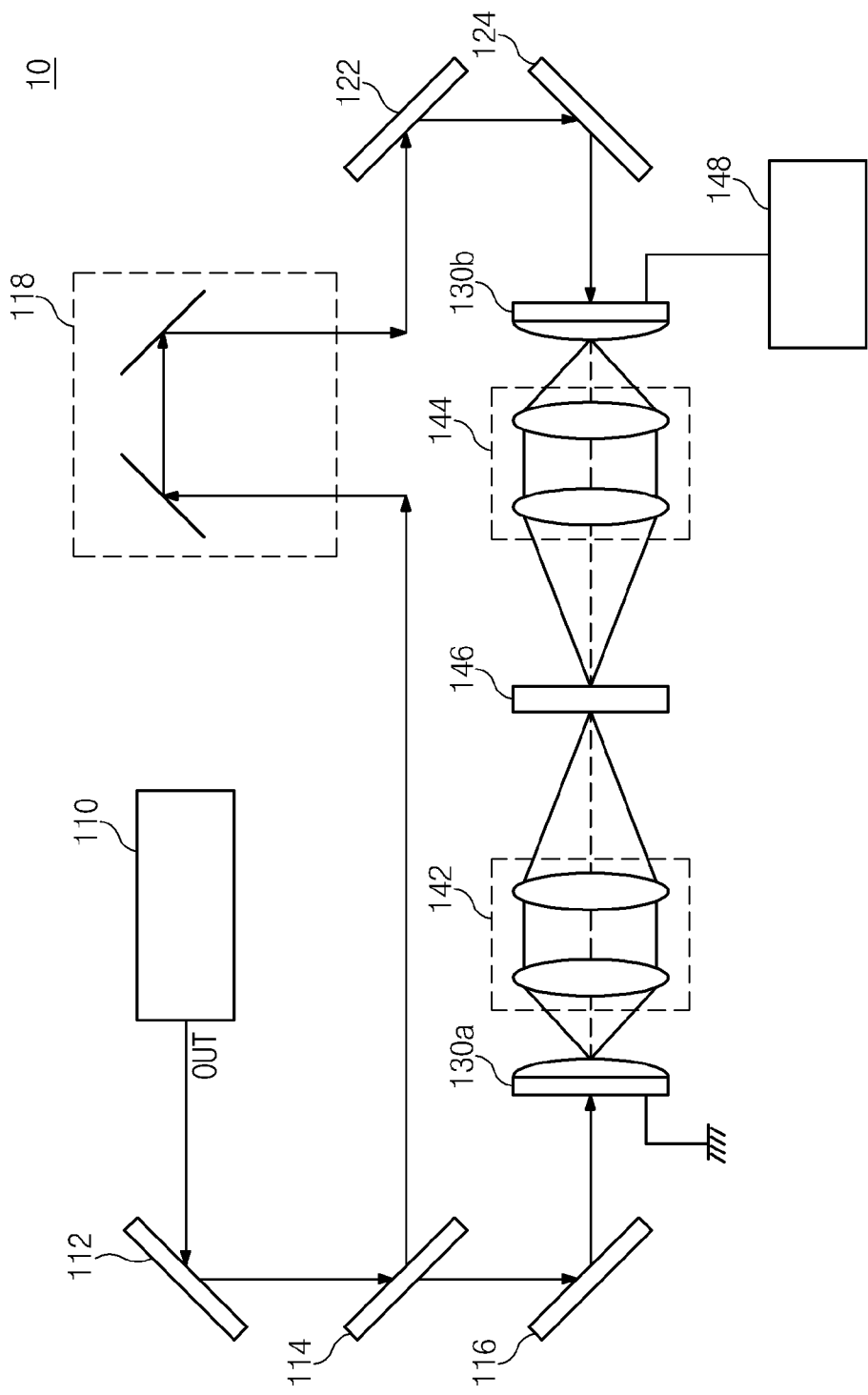
FIG. 1A is a view illustrating a typical terahertz wave apparatus for time-domain spectroscopy and FIG. 1B is a view illustrating typical data obtained using the terahertz wave apparatus of FIG. 1B.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

Also, though terms like a first and a second are used to describe various members, components, regions, layers, and/or portions in various embodiments of the present invention, the members, components, regions, layers, and/or portions are not limited to these terms.

The meaning of "include," "comprise," "including," or "comprising," specifies a property, a region, a fixed number, a step, a process, an element and/or a component but does not exclude other properties, regions, fixed numbers, steps, processes, elements and/or components.

Figure 1B:
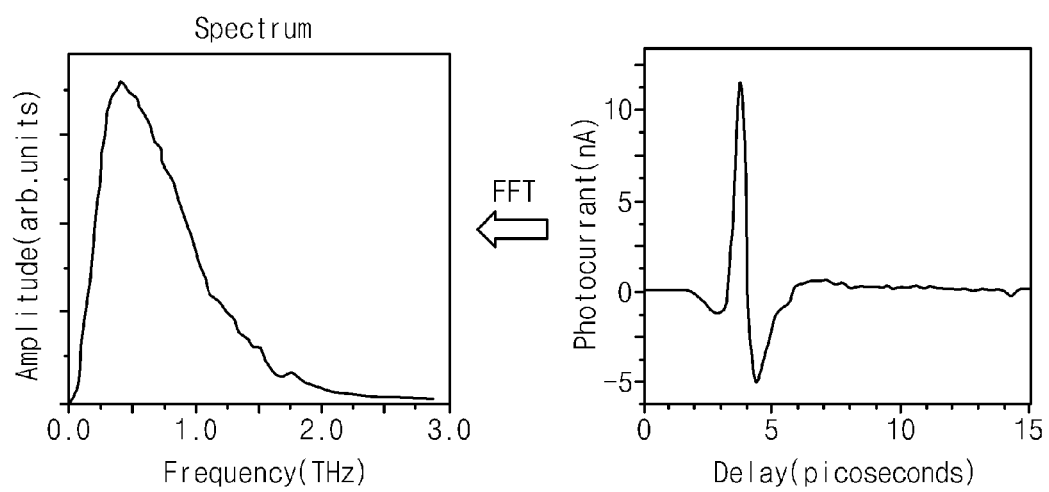

FIG. 1A is a view illustrating a typical terahertz wave apparatus for time-domain spectroscopy (TDS). FIG. 1B is a view illustrating typical data obtained using the terahertz wave apparatus of FIG. 1A.

Referring to FIGS. 1A and 1B, the apparatus 10 may generate and/or detects terahertz waves using an ultra-short pulse laser 110. The apparatus 10 may be a TDS system. The apparatus 10 is advantageous in obtaining a high signal to noise ratio (SNR) through a homodyne detection method for obtaining data only during a gating time of a femto second level.

An output light of the ultra-short pulse laser 110 may change its path using a first mirror 112. The output light of the ultra-short pulse laser 110 reflected from the first mirror 112 may be divided into two pulses using a beam splitter (or BS) 114. One ultra-short pulse is incident to a terahertz wave generator (or THz Tx) 130a through a second mirror 116, thereby generating a terahertz wave. Another ultra-short pulse is incident to a terahertz wave detector (or THz Dx) 130b with an appropriate time delay and thus is used for sampling of a terahertz wave with respect to time. The terahertz generator 130a and the terahertz detector 130b may be a photoconductive antenna. The time delay may be obtained using a delay line (DL) 118. An output light of the DL 118 may be provided to a terahertz detector 130b through a third mirror 122 and a fourth mirror 124.

The terahertz wave generated from the terahertz wave generator 130a may be focused on a sample 146 through a first focusing lens 142. The terahertz wave transmitted through the sample 146 may be incident to the terahertz detector 130b through a second focusing lens 144.

The terahertz wave detector 130b may generate an electric signal relying on a time delay. The electric signal may be obtained by a data acquisition system 148. The data acquisition device 148 may be a high-speed Analog to digital (A/D) converter or a high-speed oscilloscope.

Referring to FIG. 1B, the electric signal relying on the time delay may be converted to a spectrum of a terahertz wave through fast fourier transform (FFT).

In an terahertz wave apparatus for time-domain spectroscopy, a terahertz wave may be generated by acceleration of a carrier created by projecting a femto second level ultra-short laser pulse on a semiconductor. The terahertz wave apparatus for time-domain spectroscopy has the advantage of acquiring a high SNR through a homodyne detection method of a femto second level gating time, such that it has been widely used for researches. An ultra-short laser pulse of a femto second level in an about 800 nm wavelength band is divided into two. One is incident to the terahertz wave generator (or THz Tx) and then is used for generating a terahertz wave. The other is incident to the terahertz wave detector (or THz Dx) with an appropriate time delay. The data acquisition device acquires the data relying on a delay time from the terahertz wave detector and the data should be converted to a spectrum of a terahertz wave through FFT. The FFT may limit real-time applications of the terahertz wave apparatus, aside from its size and price.

A frequency-tunable terahertz wave source used for frequency-domain spectroscopy is required to overcome the above limitations of the terahertz wave apparatus for time-domain spectroscopy. In addition, a demand on a frequency-tunable terahertz wave source is expected to be gradually increased in greatly various fields such as hazardous substance detection, advanced material property measurement, and freshness measurement of agricultural and marine products.

Figure 2:
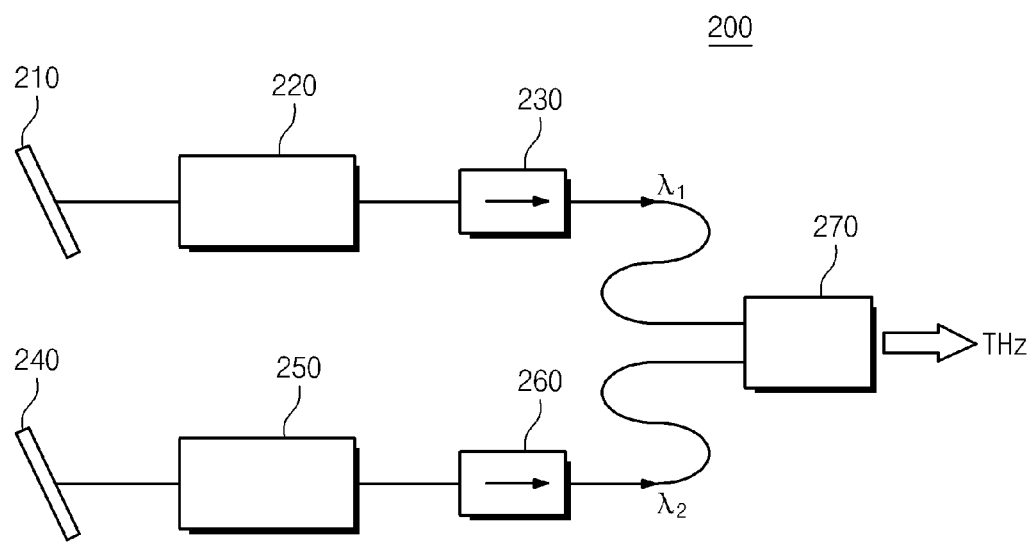
FIG. 2 is a view illustrating a terahertz wave apparatus using two mode-locked lasers to generate a terahertz wave.

FIG. 2 is a view illustrating a terahertz wave apparatus using two mode-locked lasers to generate a terahertz wave.

Referring to FIG. 2, one sides of laser diodes 220 and 250 have anti-reflection coating and may tune a wavelength using gratings 210 and 240. The laser diodes 220 and 250 emit a laser light having different two wavelengths $\lambda 1$ and $\lambda 2$. The terahertz wave apparatus of FIG. 2 projects high-power two lasers having respectively different wavelengths $\lambda 1$ and $\lambda 2$ on a photomixer 270 having a high-speed response time to generate a terahertz wave.

In order for generating a wavelength tunable continuous terahertz wave using the photomixer 270, two separate light sources are required. The light sources may be high-power wavelength tuning lasers. A frequency difference between the wavelength tuning lasers may correspond to a frequency of a terahertz wave. Characteristics of respectively different wavelengths may directly affect noise characteristic of the terahertz wave.

The photomixer 270 may have the following conversion efficiency.

$$P_{THz} = 2(I_0)^2 R_A \frac{mP_1 P_2}{P_0^2 [1+(\omega\tau)^2][1+\omega R_A C)^2]} \quad \text{[Equation 1]}$$

where $P_1$ and $P_2$ are optical powers of two lasers having respectively different wavelengths, $P_0$ is an average optical power, $I_0$ is a dc photocurrent, $R_A$ is a radiation resistance of an antenna, c is an electrostatic capacitance of a photo mixer, $\tau$ is a carrier lifetime of a photomixer, and m is a mixing ratio of two wavelengths.

In order to efficiently generate a terahertz wave, parameters that affect conversion efficiency of the photomixer 270 need to be adjusted. The conversion efficiency of the photomixer 270 may be affected by a carrier lifetime of a photomixer, a radiation resistance of an antenna, and a mixing ratio of two wavelengths.

In relation to the terahertz generating and detecting system using a photomixing method, methods using excitation light of about 1.5 µm and about 1.3 µm bands are suggested. This is because most of core technologies such as ultra-compact modularization technology and ultrahigh-speed signal processing technology are developed already such that they can be relatively easily utilized and because an optical amplifier of about 1.5 µm and about 1.3 µm bands is developed already and also high conversion efficiency can be obtained in a long wavelength compared to a short wavelength.

A wavelength difference ($\Delta\lambda$) between two lasers is related to a frequency of a terahertz wave by $f=c\Delta\lambda/\lambda^2$. Wavelength properties of the two lasers may directly affect the property of a terahertz wave. The frequency f of a terahertz wave may be determined by a difference between frequencies $f_1=c/\lambda_1$ and $f_2=c/\lambda_2$ corresponding to wavelengths $\lambda_1$ and $\lambda_2$. That is, wavelength tuning property of an excitation laser becomes very important. For terahertz frequency tuning amounting to 1 THz, a wavelength tuning laser of which a wavelength is tunable in a range of about 8 nm in a 1.5 µm wavelength region and in a range of about 6 nm in a 1.3 µm wavelength region needs to be developed. A laser technique providing a wideband wavelength tuning characteristic and a very narrow wavelength line width is necessary.

Figure 3:
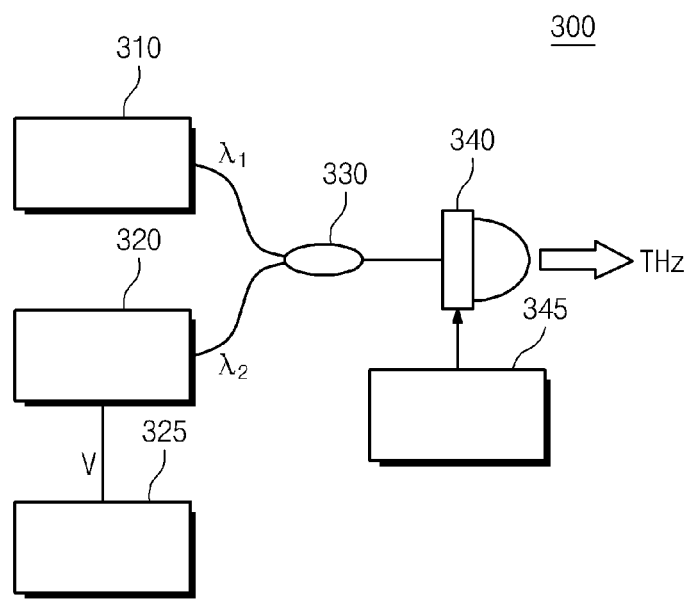
FIG. 3 is a view illustrating a terahertz wave apparatus used for generating a terahertz wave according to an embodiment of the present invention.

FIG. 3 is a view illustrating a terahertz wave apparatus used for generating a terahertz wave according to an embodiment of the present invention.

Referring to FIG. 3, the terahertz wave apparatus 300 includes a wavelength-fixed laser 310, a wavelength-swept laser 320, a high frequency driver 325, a coupler 330, a generator 340, and a dc voltage unit 345. The generator 340 may be a photomixer.

The wavelength-fixed laser 310 emits a first laser light having a fixed first wavelength. The wavelength-fixed laser 310 may include a laser light source and a cavity. The cavity may have a bragg grating and the bragg grating may selectively reflect light of a specific wavelength. The bragg grating may resonate a first laser light having a first wavelength $\lambda_1$. The wavelength-fixed laser 310 may be a mode-locked laser. Due to this, the first laser light may be a locked laser light and a slave-mode except for a master mode is reduced such that a spectrum of a narrow band can be obtained. That is, the first wavelength may be determined with a wavelength of the master mode. The first laser light having the spectrum of a narrow band may participate in generating a terahertz laser.

The wavelength-swept laser 320 emits a second laser light having a tunable second wavelength $\lambda_2$. The wavelength-swept laser 320 is a laser that continuously sweeps or scans a wavelength. The wavelength-swept laser 320 may sweep the second wavelength $\lambda_2$ using a high frequency driver or a function generator 325. The high frequency driver 325 may apply a voltage V of a pulse form.

The wavelength-swept laser 320 may be classified into two through a filtering method. One is post-filtering and the other is cavity tuning filtering. In relation to the post-filtering, a wavelength tuning filter is inserted in a wideband light source output terminal in order for filtering and since a portion of the output is not fed back to gain medium, loss of a light source due to a filter is large such that output power is small. In relation to the cavity tuning filtering, a filter is inserted in a laser cavity in order for filtering and a portion of an output is fed back to gain medium. A wavelength-swept laser using the cavity tuning filtering will be described in more detail with reference to FIG. 4.

The coupler 330 couples the first laser light and the second laser light. The coupler 330 may mix the first laser light and the second laser light and may emit the mixed light. The generator 340 (e.g., a photomixer) converts the mixed light emitted from the coupler 330 into a terahertz wave. If the generator 340 is a photomixer, the generator 340 may include a photoconductor and an antenna. The photoconductor converts the mixed light into a photocurrent, and the photocurrent may generate a terahertz wave through the antenna. The generator 340 may receive the mixed light while a voltage is applied by the DC voltage unit 345.

The generator 340 may generate a terahertz wave having a frequency corresponding to a wavelength difference between the first wavelength and the second wavelength. Accordingly, the wavelength difference is continuously changed by the fixed first wavelength and the tunable second wavelength and thus, a frequency of the terahertz wave may continuously change. In more detail, the photomixer 340 may generate a terahertz wave having a frequency that corresponds to a wavelength difference between the first wavelength and the second wavelength. A speed of changing the wavelength difference may depend on a scan (swept) speed of the wavelength swept laser 320. As a result, a frequency tuning speed of a terahertz wave may depend on a wavelength swept speed of the wavelength-swept laser 320. The scan rate may be several kHz to tens of kHz. For example, when the first wavelength is about 1530 nm and the second wavelength is about 1530 nm to about 1562, a terahertz wave may be tunable from about 0 to about 4 THz at a scan rate of about 40 KHz.

Figure 4:
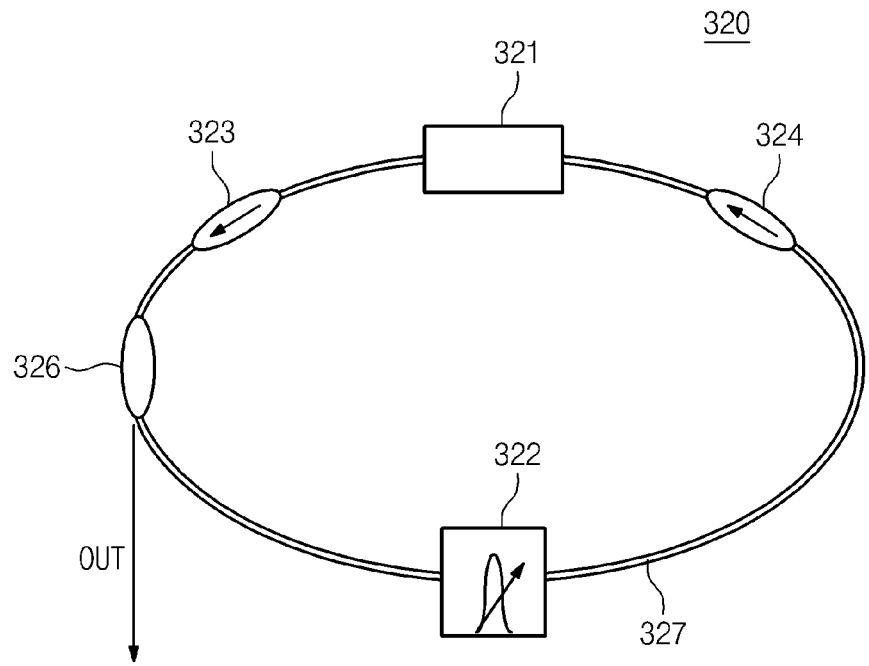
FIG. 4 is a view illustrating the wavelength-swept laser 320 according to an embodiment of the present invention.

FIG. 4 is a view illustrating the wavelength-swept laser 320 according to an embodiment of the present invention.

Referring to FIG. 4, the wavelength swept laser 320 may include a gain medium 321 and a wavelength tuning filter 322 for filtering the emitted light from the gain medium 321 into the second wavelength. The gain medium 321 and the wavelength tuning filter 322 may be coupled to an optical fiber 327. The gain medium 321 may include a semiconductor optical amplifier. The semiconductor optical amplifier may have a gain in a 1300 nm band. Or, the gain medium 321 may be a rare-earth element-doped fiber amplifier. For example, the gain medium 321 may be an erbium-doped fiber amplifier or an ytterbium-doped fiber amplifier.

The wavelength tuning filter 322 may be a fiber fabry-perot tunable filter (FFP-TF). The wavelength tuning filter 322 and the gain medium 321 are integrally coupled to an optical fiber, such that the wavelength-swept laser 320 can be realized with a short length cavity. Unlike this, the wavelength-swept laser 320 may be realized with a polygon wavelength filter including a polygon mirror, which is rotatable at high speed, and a diffraction grating. Or, the wavelength-swept laser 320 may use a technique of adjusting a time that light circulates a cavity through a delay line installed in an optical fiber. In this case, when the time that light circulates a cavity is a multiple of a sweep period of a filter, each wavelength component penetrates a filter to keep circulating a cavity, thereby resonating.

A first optical isolator 323 and a second optical isolator 324 are disposed between the gain medium 321 and the wavelength tuning filter 322. The first optical isolator 323 and the second optical isolator 324 progress a laser light in one direction. That is, the first optical isolator 323 and the second optical isolator 324 pass a laser light in one direction and block a laser light in an opposite direction. The wavelength-swept laser may output the second laser light through the output fiber coupler 326. The output fiber coupler 326 feeds back about 70% of the second laser light to the gain medium 321 and outputs about 30% of the second laser light. The outputted second laser light may be measured and analyzed using a sampling oscilloscope and an optical spectrum analyzer (OSA).

The wavelength-swept laser 320 may be the above-mentioned cavity tuning filtering method. The cavity tuning filtering method, as shown in FIG. 4, inserts the wavelength tuning filter 322 into a laser cavity to filter a predetermined wavelength and feeds back a portion of an output into the gain medium 321 again. The optical fiber Febry-Perot tuning filter may include a piezoelectric element (for example, PZT). If a voltage V applied to the piezoelectric element is changed, an interval of a filter opening is adjusted such that a filtering wavelength may be turned. Due to this, a window determined from the wavelength tuning filter 322 may move for filtering in a wavelength band obtained from the gain medium 321.

Figure 5:
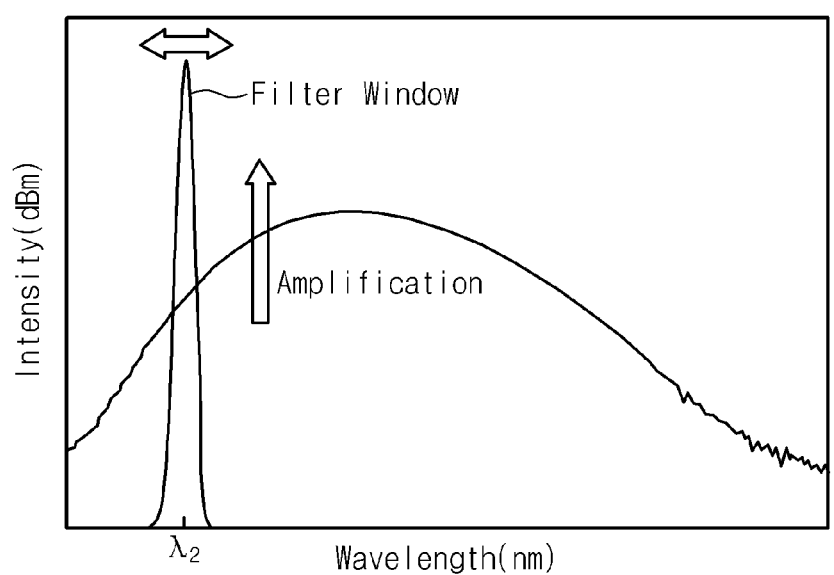
FIG. 5 is a graph illustrating a filtering operation of a wavelength swept laser according to an embodiment of the present invention.

FIG. 5 is a graph illustrating a filtering operation of a wavelength swept laser according to an embodiment of the present invention.

Referring to FIG. 5, the wavelength-swept laser 320 may change a wavelength of the second laser light according to a change of a voltage V. The wavelength tuning filter 322 may scan a filtering band pass wavelength during one period once it is modulated as a sine function at a frequency. In more detail, forward scan (from a short wavelength to a long wavelength in a predetermined wavelength range) is performed with a voltage increased and backward scan (from a long wavelength to a short wavelength in a predetermined wavelength range) is performed with a voltage decreased. If both the wavelength scans are used, effective scan frequency may be the double of a modulation frequency.

The wavelength tuning filter 322 may scan in a predetermined wavelength range at a high scan rate according to a voltage V applied by a high frequency driver 325. For example, the wavelength scan rate may be several kHz. According to a wavelength scan of the wavelength tuning filter 322 or a movement of the filter window, the second wavelength $\lambda_2$ may be scanned in a wavelength band obtained from the gain medium 321.

In general, the maximum wavelength scan rate of the wavelength swept laser 320 is limited to a time constant where a laser is formed by amplified spontaneous emission and this time constant depends on a filter property, an intensity of amplified spontaneous emission, a saturated output, a laser gain, and a laser round-trip time. The wavelength-swept laser 320 using the cavity tuning filtering method has a saturation limit and one round-trip limit related to scan property of a wavelength scan rate. If the scan rate is low, light filtered by one wavelength may make a round-trip once or several times in a laser cavity at one period. In this case, the emitting time is longer than a time constant of a laser, such that the laser may have a sufficient light intensity from the amplifier spontaneous emission and this is referred to as light saturation limitation. In addition, if the wavelength scan frequency is increased gradually, the time to stay in the laser cavity of the light filtered by one wavelength becomes shorter and thus suddenly a frequency occurs, which is identical to one round-trip time of a laser. At this point, a laser output is drastically decreased and this case is referred to as a one round-trip limit sweep frequency. In those two cases, the sweep speed limitation may vary according to characteristics of a gain medium of a laser and a cavity.

Figure 6:
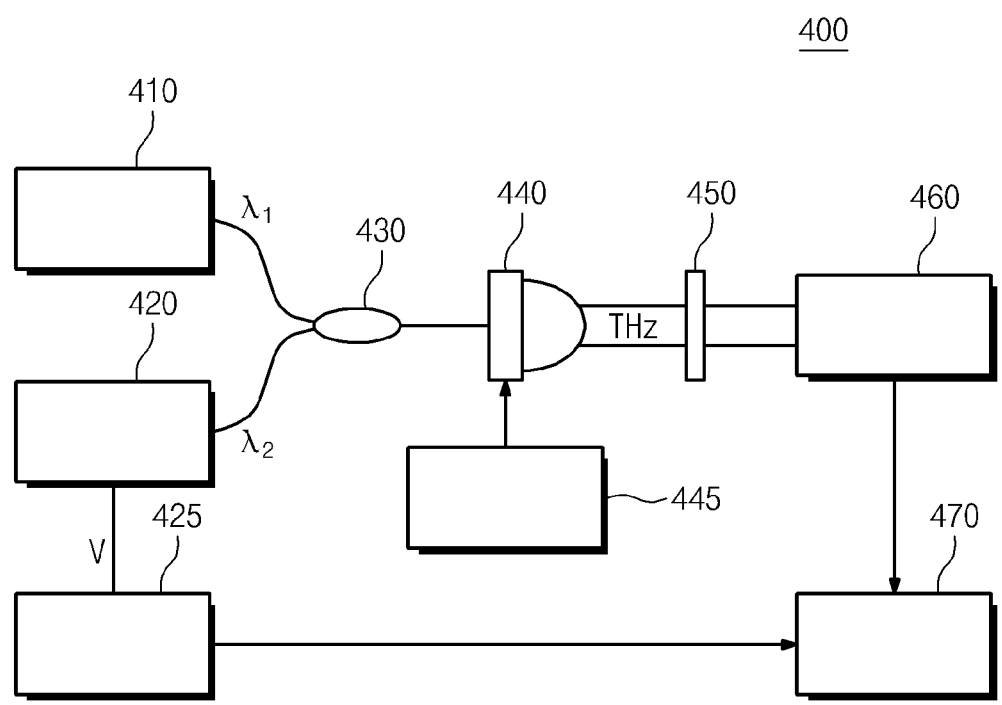
FIG. 6 is a view illustrating a terahertz wave apparatus for generating and detecting a terahertz wave according to an embodiment of the present invention.

FIG. 6 is a view illustrating a terahertz wave apparatus for generating and detecting a terahertz wave according to an embodiment of the present invention. The terahertz wave apparatus of FIG. 6 is almost similar to that of FIG. 3 and thus, their overlapping description will be omitted.

Referring to FIG. 6, the terahertz wave apparatus 400 includes a wavelength-fixed laser 410, a wavelength-swept laser 420, a high frequency driver 425, a coupler 430, a generator 440, a dc voltage unit 445, and a data acquisition device 470. The generator 440 may be a photomixer.

The wavelength-fixed laser 410 emits a first laser light having a fixed first wavelength $\lambda_1$. The wavelength-fixed laser 410 may be a mode-locked laser and may have a narrow spectrum. The wavelength-swept laser 420 emits a second laser light having a tunable second wavelength $\lambda_2$. The wavelength-swept laser 420 is a laser that continuously sweeps or scans a wavelength. The wavelength-swept laser 420 may scan the second wavelength when a voltage is applied to the laser in a pulse form from the high frequency driver 425.

The coupler 430 couples the first laser light and the second laser light. The coupler 430 may mix the first laser light and the second laser light and may emit the mixed light. The generator 440 for converting the mixed light emitted from the coupler 430 into a terahertz wave is provided. The generator 440 may be a photomixer. If the generator 440 is a photomixer, the generator 440 may include a photoconductor and an antenna. The generator 440 may receive the mixed light while a voltage is applied by the DC voltage unit 445. The generator 440 may generate a terahertz wave having a frequency corresponding to a wavelength difference between the first wavelength and the second wavelength. Accordingly, the wavelength difference is continuously changed by the fixed first wavelength and the tunable second wavelength and thus, a frequency of the terahertz wave may continuously change.

The terahertz wave generated in the generator 440 is projected on a sample 450. The terahertz wave passing through the sample 450 may be detected by the detector 460.

The data acquisition device 470 is triggered using a synchronization signal provided from the high frequency driver 425 and obtains a detection signal from the detector 460 continuously and at a high scan rate. Since the terahertz wave of which a frequency is variable at a high scan rate is detected, high-speed terahertz spectroscopy is possible. The data acquisition device 470 may be digitizer. The data acquisition device 470 may improve SNR through averaging.

According to an embodiment of the present invention, using a wavelength-fixed laser and wavelength-swept laser, a terahertz wave of which a frequency is variable at a high scan rate can be generated. A frequency scan rate of the terahertz wave may depend on a wavelength scan rate of the wavelength-swept laser. In addition, since a terahertz wave of which a frequency is variable at a high scan rate is detected, high-speed terahertz spectroscopy is possible.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. A terahertz wave apparatus comprising:
   a wavelength-fixed laser emitting a first laser light having a fixed first wavelength;
   a wavelength-swept laser emitting a second laser light having a tunable second wavelength;
   a coupler coupling the first laser light with the second laser light to form a mixed light; and a photomixer converting the mixed light emitted from the coupler into a terahertz wave, the photomixer being connected to a DC voltage unit, wherein a frequency of the terahertz wave is continuously tunable.

2. The apparatus of claim 1, wherein the generator photomixer generates a terahertz wave having a frequency that corresponds to a wavelength difference between the first wavelength and the second wavelength.

3. The apparatus of claim 1, wherein the wavelength-swept laser comprises:

a gain medium; and a wavelength tuning filter filtering light emitted from the gain medium into the second wavelength.

4. The apparatus of claim 3, wherein the gain medium and the wavelength tuning filter are combined to an optical fiber.

5. The apparatus of claim 3, wherein the gain medium comprises a semiconductor optical amplifier.

6. The apparatus of claim 3, wherein the gain medium comprises a rare-earth element-doped optical fiber.

7. The apparatus of claim 6, wherein the rare-earth element comprises at least one of Er and Yb.

8. The apparatus of claim 3, wherein the wavelength tuning filter comprises a fiber fabry-perot tunable filter (FFP-TF).

9. The apparatus of claim 8, wherein the wavelength-swept laser further comprises a high frequency driver applying a voltage in a pulse form to the FFT-TF.

10. The apparatus of claim 9, wherein the FFT-TF filters the continuously tuned second wavelength according to the applied voltage.

11. The apparatus of claim 9, further comprising a detector detecting a terahertz wave that is emitted from the photomixer and transmitted through a sample.

12. The apparatus of claim 11, further comprising a data acquisition device triggered using a synchronization signal provided from the high frequency driver and continuously acquiring a detection signal from the detector.

13. The apparatus of claim 3, wherein the wavelength-swept laser further comprises an optical isolator that progresses the second laser light in one direction.

14. The apparatus of claim 3, wherein the wavelength-swept laser further comprises an output optical fiber coupler outputting a portion and feeding back another portion to the gain medium.

* * * * *